(12) United States Patent
Wikstroem

(10) Patent No.: US 10,892,245 B2
(45) Date of Patent: Jan. 12, 2021

(54) SEMICONDUCTOR SWITCHING DEVICE

(71) Applicant: ABB Power Grids Switzerland AG, Baden (CH)

(72) Inventor: Tobias Wikstroem, Egliswil (CH)

(73) Assignee: ABB Power Grids Switzerland AG, Baden (CH)

(*) Notice: Subject to any disclaimer, the term of this patent is extended or adjusted under 35 U.S.C. 154(b) by 0 days.

(21) Appl. No.: 16/514,429

(22) Filed: Jul. 17, 2019

(65) Prior Publication Data

US 2019/0363065 A1    Nov. 28, 2019

Related U.S. Application Data

(63) Continuation of application No. PCT/EP2018/051018, filed on Jan. 16, 2018.

(30) Foreign Application Priority Data

Jan. 17, 2017  (EP) ..................... 17151841

(51) Int. Cl.
*H01L 23/00* (2006.01)
*H01L 23/051* (2006.01)

(52) U.S. Cl.
CPC .......... *H01L 24/72* (2013.01); *H01L 23/051* (2013.01)

(58) Field of Classification Search
CPC ............................. H01L 23/00; H01L 23/051
See application file for complete search history.

(56) References Cited

U.S. PATENT DOCUMENTS

| 3,884,457 | A | * | 5/1975 | Leko | ............. F16F 3/02 267/162 |
| 3,991,461 | A | * | 11/1976 | Anderson | ............. H01L 21/52 257/785 |
| 5,278,434 | A | | 1/1994 | Niwayama | |
| 2008/0073767 | A1 | * | 3/2008 | Taguchi | ............. H01L 23/051 257/683 |

(Continued)

FOREIGN PATENT DOCUMENTS

| DE | 2942585 A1 | 5/1980 |
| EP | 1220314 A2 | 7/2002 |
| JP | H09232345 A | 9/1997 |

OTHER PUBLICATIONS

European Patent Office, International Search Report & Written Opinion issued in corresponding Application No. PCT/EP2018/051018, dated Apr. 23, 2018, 10 pp.

*Primary Examiner* — Sheng-Bai Zhu
(74) *Attorney, Agent, or Firm* — Slater Matsil, LLP

(57) ABSTRACT

The invention relates to a semi-fabricated switching device comprising a semiconductor element and a housing comprising a spring system with a ring-shaped washer laterally surrounding the semiconductor element for clamping the semiconductor element between two pole pieces. The washer is deflectable between the pole pieces by a first deflection element, which contacts the washer in a first contact area on a first side, and by a second deflection element, which contacts the washer in a second contact area on a second side. The first contact area is displaced to the second contact area. The first and second deflection element can deflect the washer such that in clamped condition an electrical contact is achievable between the pole pieces and the semiconductor element.

20 Claims, 5 Drawing Sheets

(56) References Cited

U.S. PATENT DOCUMENTS

2016/0071815 A1\* 3/2016 Stiasny .................. H01L 23/32
                                                              257/689
2017/0133407 A1\* 5/2017 Sun .................... B29D 11/0073

\* cited by examiner

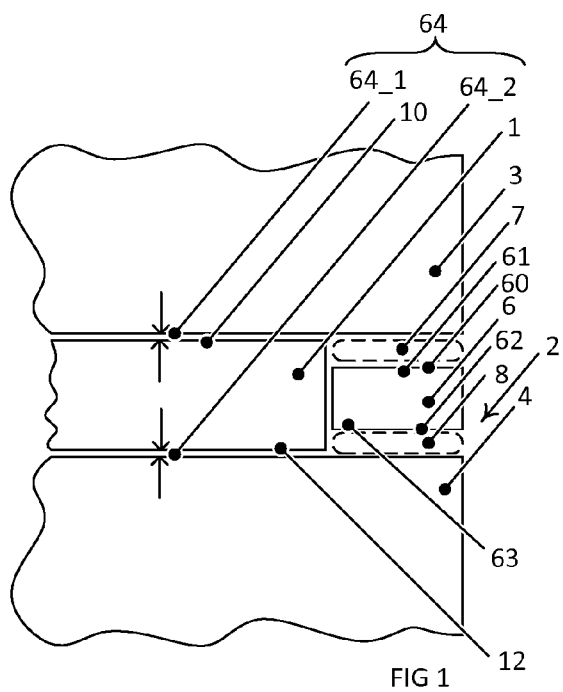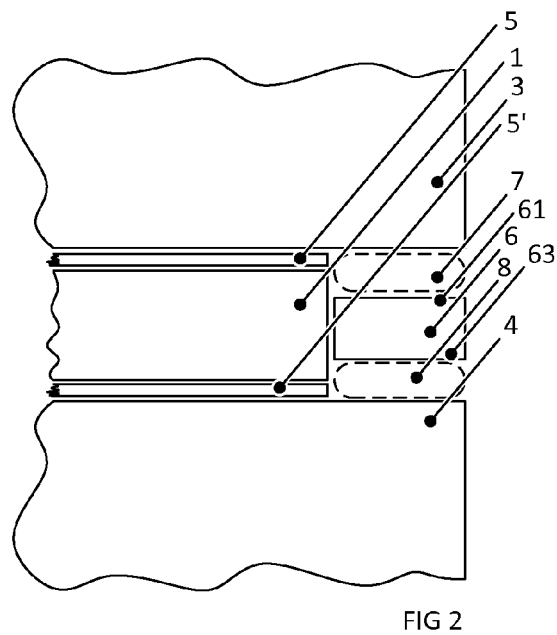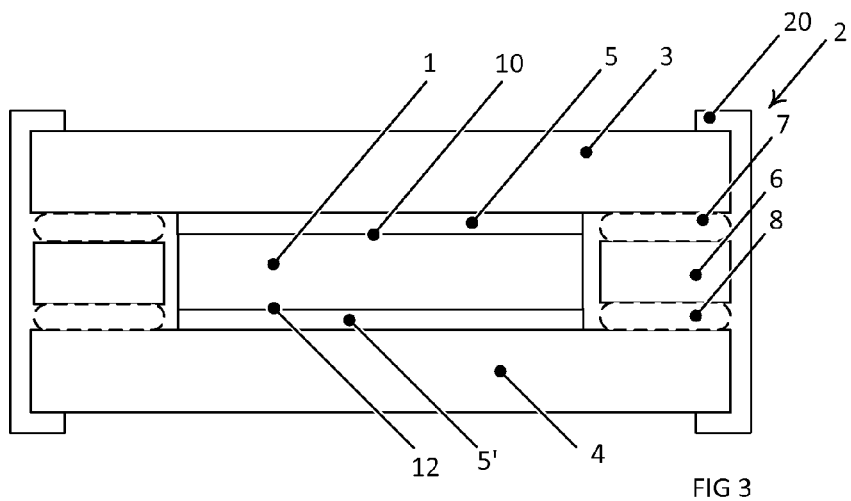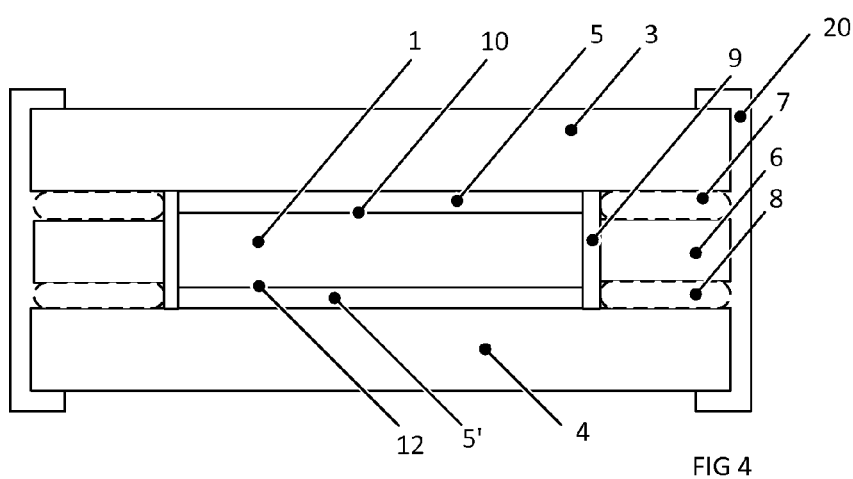

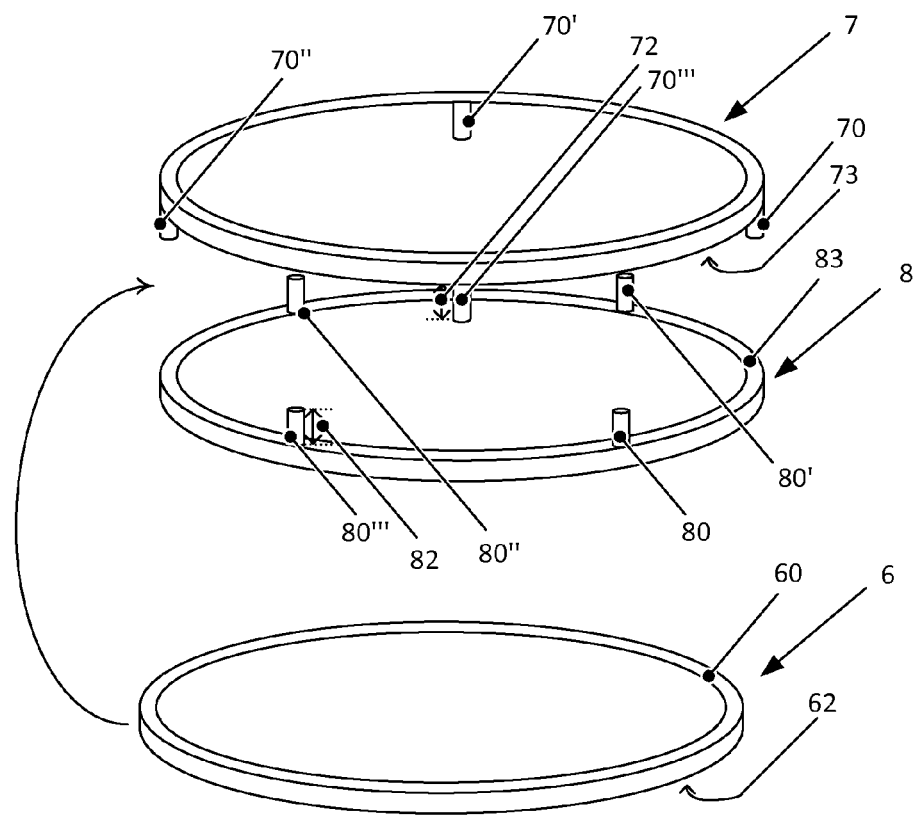
FIG 5
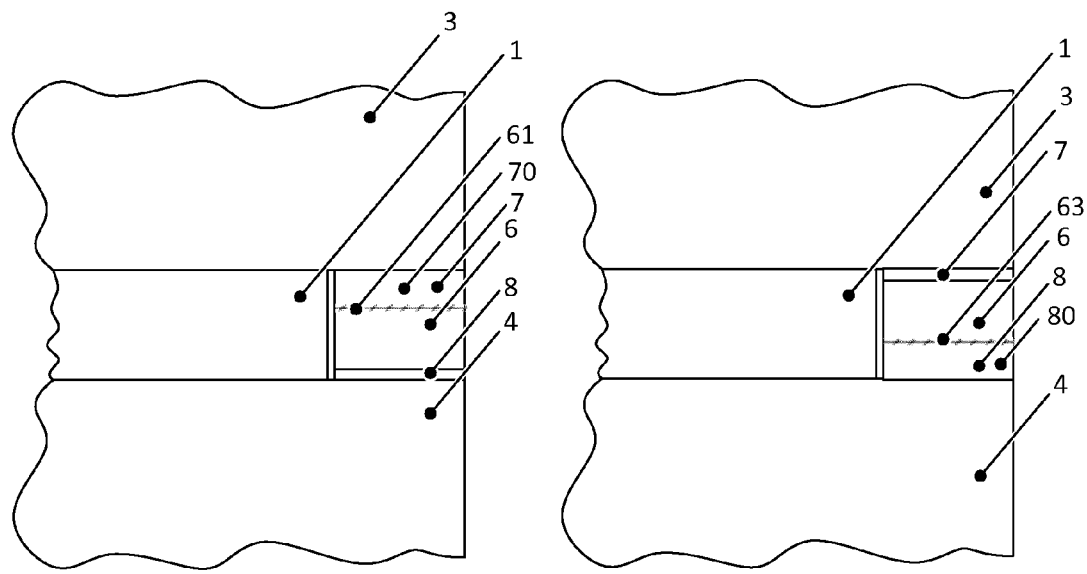
FIG 6
Fig 7

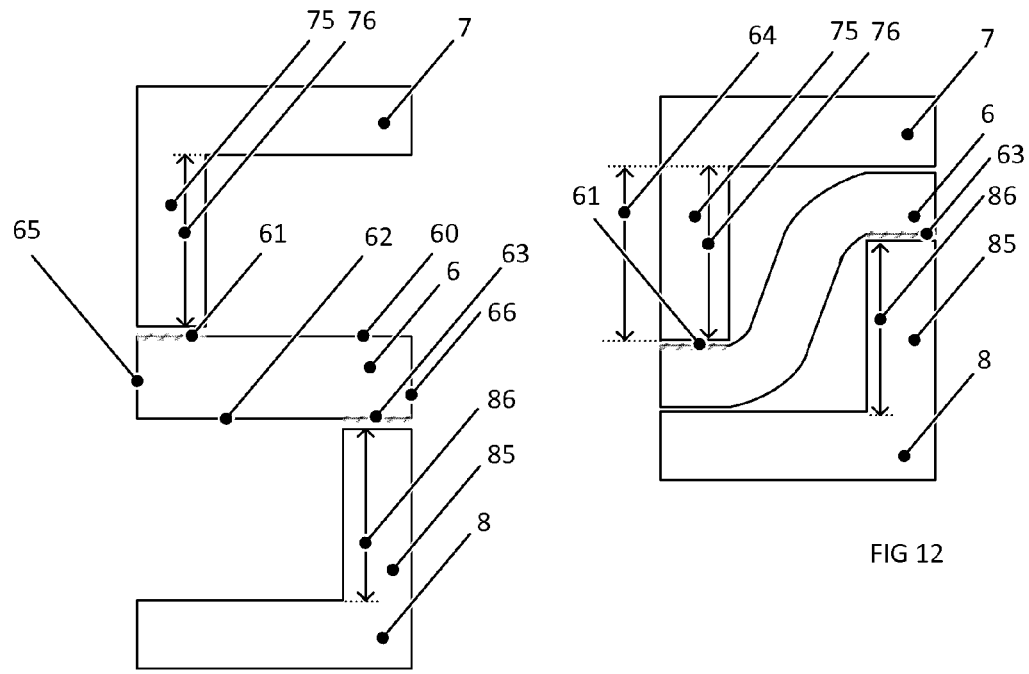
FIG 11
FIG 12
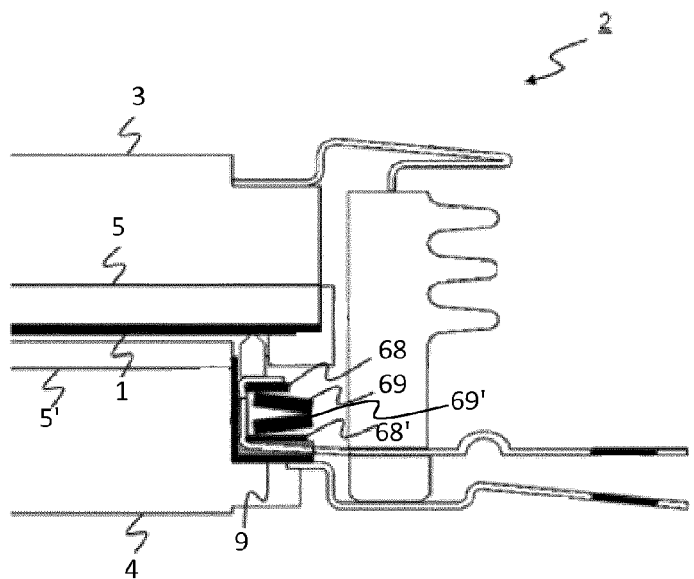
FIG 13

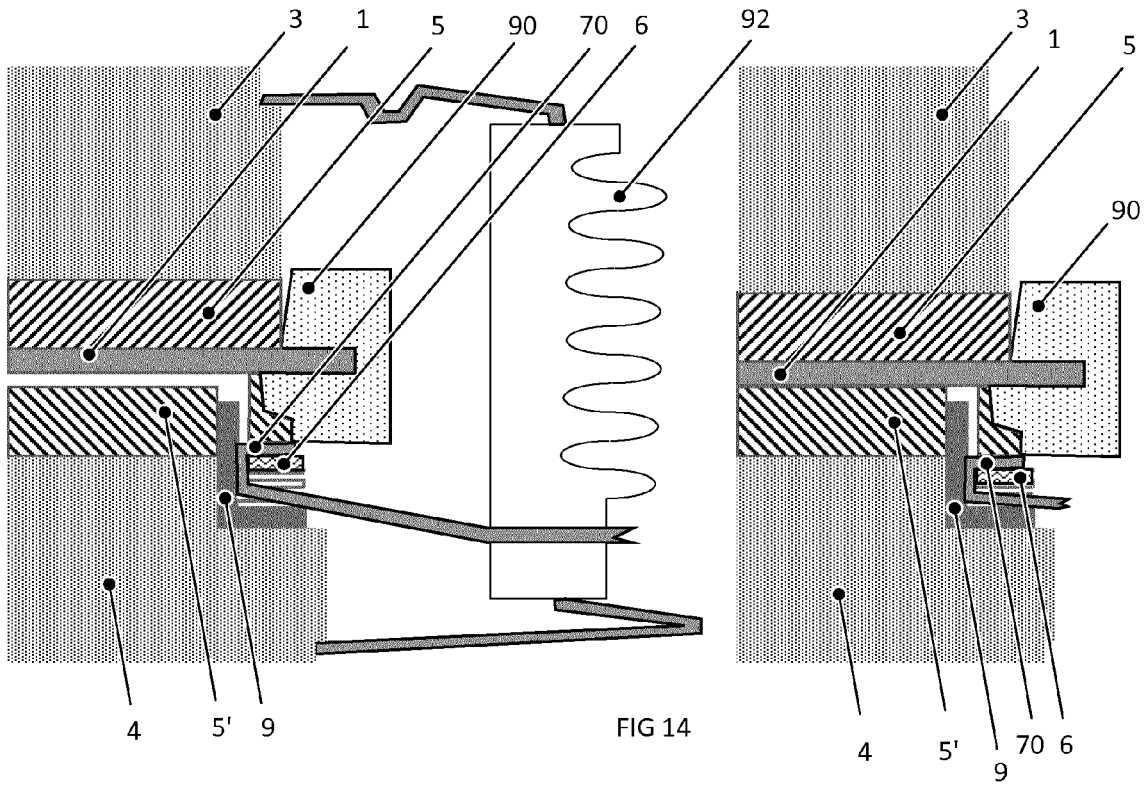
FIG 14
FIG 15
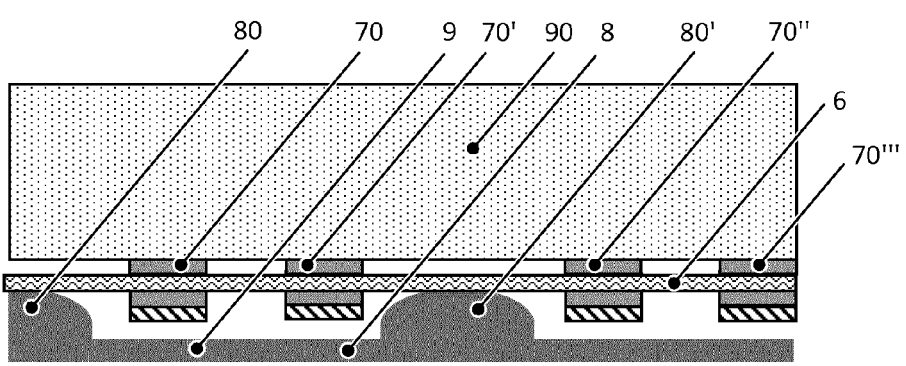
FIG 16
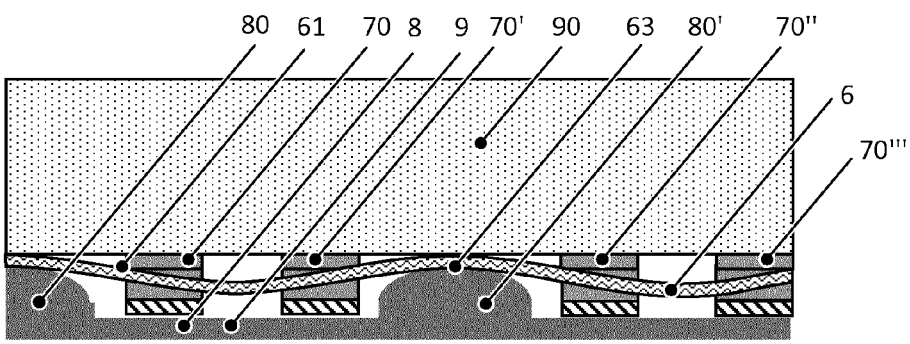
FIG 17

SEMICONDUCTOR SWITCHING DEVICE

FIELD OF THE INVENTION

The invention relates to the field of power electronics, in particular to a semiconductor switching device.

BACKGROUND OF THE INVENTION

Semiconductor switching devices are powerful and fast turnoff components having a cathode-anode-gate structure. Specifically, the semiconductor switching device comprises a semiconductor element having deposited thereon a cathode, an anode, and a gate of the switching device. The device further comprises connection means for electrically connecting the cathode, the anode and the gate of the switching device to an external circuit unit.

A semiconductor element has to handle large currents and voltages. One example of such a semiconductor element is an integrated gate commutated thyristor (IGCT). An IGCT is a gate-controlled turn-off switch which turns off like an insulated gate bipolar transistor (IGBT), but conducts like a thyristor with the lowest conductor losses. An integrated gate commutated thyristor is a power switching device for demanding high power applications such as, e.g. medium voltage drives, traction, wind power converters, AC excitation systems, battery energy storage systems, solid state breakers, traction line boosters, traction power compensators and induction heating.

A semiconductor element constructed as an IGCT nowadays is used in a variety of applications due to its versatility, efficiency and cost effectiveness. A conventional IGCT device has a ring-shaped structure where on a cathode disc a gate disc is arranged providing a gate connection to the switching device. An anode phase is arranged on top of a housing having for instance a specific creepage distance at the outside.

US 2016071815 A1 shows a semiconductor switching device having a semiconductor element 1 and a housing with a spring system, by which the semiconductor element 1 is clamped between the cathode and anode pole piece 3, 4 (FIG. 1). The spring system comprises two Belleville springs 69, 69', which are clamped between the pole pieces 3, 4 and thereby clamp the semiconductor element 1 to achieve a contact of the main electrodes of the semiconductor element to the pole pieces 3, 4. An insulating ring 9 with an L profile is arranged between the semiconductor element 1 and the spring system. One of the Belleville springs 69' lies on the insulating ring 9 with gate leads clamped in between. Additional support elements 68, 68' are positioned between the Belleville springs and the insulating ring 9 to protect the insulating ring 9 and gate leads from sharp edges of the Belleville spring 69, 69'.

Such a semiconductor switching device may be semi-fabricated with the semiconductor element 1 positioned between the pole pieces 3, 4 and the spring system surrounding the semiconductor element 1. The semi-fabricated switching device can be shipped from a factory to a costumers' place, where it can be can be installed in its final surrounding and clamped to establish the electrical contact from the semiconductor element 1 to the pole pieces 3, 4.

For manufacturing the semi-fabricated semiconductor switching device it is important to be able to mount the semiconductor element easily in the housing. Furthermore, proper alignment and support of all parts inside a housing is important to guarantee proper contacting even after transport.

EP 1 220 314 A2 shows another prior art pressure contact for a thyristor module. Two ring pieces surrounding the thyristor latch in each other by having protrusions and recesses. To the lateral sides, the ring system is insulated by an insulation element. On the top side, an electrical main connector leads upwards. Each thyristor element is fixed to the base plate by three tension screws arranged around each ring system. To the bottom side, a plurality of such thyristors are separately insulated from a base plate. The thyristors are arranged laterally from each, electrically connected to each other by a common main electrode plate, i.e. no compact arrangement is possible and the thyristors cannot be arranged in stack configuration. As all thyristors have to be directly mounted on the common base plate together, no modular design and no semi-fabrication is possible. The applied spring force depends on the force, by which each tension screw is tightened. Furthermore, as a plurality of tension screws have to be tightened for each semiconductor element, a tilting is possible, which may lead to bad or no electrical connection from the semiconductor element to the pole pieces.

DE 29 42 585 describes a semiconductor device, in which a semiconductor element is clamped between cathode and anode pole pieces with a deflectable silicon ring between the pole pieces. Outwardly arranged extensions of the pole pieces are pressed together by an insulator with inwardly tapered extensions, which cover the extensions of the pole pieces. The silicon ring is pressed against the pole pieces along a circular area on opposite sides of the silicon ring.

DESCRIPTION OF THE INVENTION

It is an objective of the invention to provide a semi-fabricated switching device and a semiconductor switching device as such with a spring system, which is easy to mount, cost efficient and reliable.

An inventive semi-fabricated semiconductor switching device comprises a semiconductor element having a cathode side and an anode side opposite to the cathode side and a housing. The housing comprises a cathode pole piece, which is arranged on the semiconductor element on the cathode side, an anode pole piece, which is arranged on the semiconductor element on the anode side, wherein the cathode pole piece and the anode pole piece laterally project beyond the semiconductor element. A spring system laterally surrounds the semiconductor element for clamping the semiconductor element between the cathode pole piece and anode pole piece.

The spring system comprises a ring-shaped washer laterally surrounding the semiconductor element, which washer has a first side and second side opposite to the first side. The washer is made of a material, which keeps its shape reproducibly under deformation at least up to a spring deflection. The washer is deflectable between the cathode pole piece and the anode pole piece by a first deflection element, which contacts the washer in a first contact area of the washer on the first side, and by a second deflection element, which contacts the washer in a second contact area of the washer on the second side, wherein the first contact area is displaced to the second contact area. The first deflection element and the second deflection element are adapted to deflect the washer during clamping by a strain distance, which is less or equal to the spring deflection, wherein the strain distance is so large that in clamped condition an electrical contact is achievable between the cathode pole piece, the semiconductor element and the anode pole piece.

The washer in form of a spring washer is a very simple and low cost element. As large force, exemplarily of at least 1 kN is applied on the pole pieces, and as the strain distance is small, exemplarily up to 1.5 mm, there are no high requirements for the spring properties of the washer. Therefore, no sophisticated spring system is needed. The deflection elements define the maximum strain distance and equalize the height differences between the washer and the pole pieces, the washer itself does not have high height requirements so that the same washer may be used for different switching devices.

The deflection elements are simple and low costs elements, which may be have protrusions as rings, pins or bars. The deflection elements may also be integrally formed with the pole pieces, a gate lead ring or an insulation ring. Such an integrally formed deflection element does not have to be separately mounted and therefore, makes the manufacturing simpler. A combination of one integrally formed deflection element (with the pole piece, insulation ring or gate leads) and one separate deflection element combines the advantages of simple mounting and modular constructions.

Alignment elements on the deflection elements and/or on the washer can help to mount the elements in correct position.

BRIEF DESCRIPTION OF THE DRAWINGS

The subject matter of the invention will be explained in more detail in the following text with reference to preferred exemplary embodiments which are illustrated in the attached drawings, in which:

FIG. 1 shows a sectional view on an inventive semi-fabricated semiconductor switching device;

FIG. 2 shows a sectional view on an inventive semi-fabricated semiconductor switching device comprising strain buffer plates;

FIG. 3 shows a sectional view on an inventive semiconductor switching device;

FIG. 4 shows a sectional view on an inventive semiconductor switching device comprising strain buffer plates;

FIG. 5 shows a view on an inventive first deflection element with first protruding elements, second deflection element with second protruding elements and washer;

FIGS. 6 and 7 show sectional views on the inventive semiconductor switching device with a first and second deflection element and washer of FIG. 5 in clamped condition.

FIG. 11 shows a sectional view on an inventive first deflection element with a third protruding element, a second deflection element with a fourth protruding element and a washer;

FIG. 12 shows a sectional view on an inventive first deflection element with a third protruding element, a second deflection element with a fourth protruding element and a washer in clamped condition;

FIG. 13 shows a sectional view on prior art semiconductor switching device with Belleville springs;

FIG. 14 shows a sectional view on an inventive semiconductor switching device in unclamped condition;

FIG. 15 shows a sectional view on the inventive semiconductor switching device of FIG. 14 in clamped condition;

FIG. 16 shows a side view on the inventive semiconductor switching device of FIG. 14 in unclamped condition;

FIG. 17 shows a side view on the inventive semiconductor switching device of FIG. 14 in clamped condition.

The reference symbols used in the drawings, and their meanings, are listed in summary form in the list of designations. In principle, identical parts are provided with the same reference symbols in the figures.

DETAILED DESCRIPTION OF PREFERRED EMBODIMENTS

Figure 8:
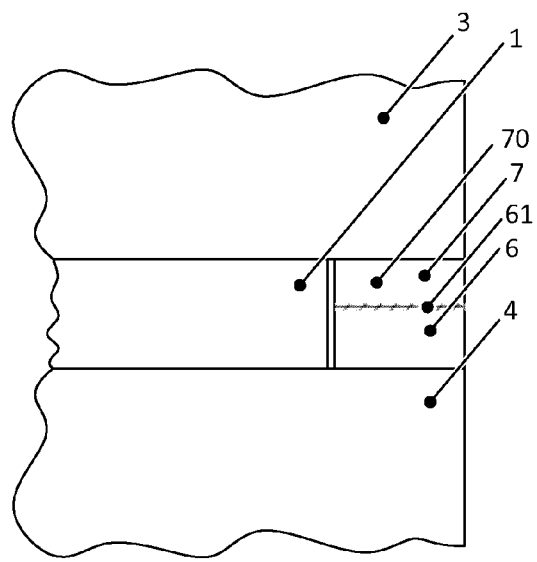
FIGS. 8 and 9 show sectional views on an inventive semiconductor switching device with a first and second deflection elements comprising first and second protruding elements in clamped condition.

FIG. 1 shows a semi-fabricated semiconductor switching device comprising a semiconductor element 1 such as an IGCT having a cathode side 10 and an anode side 12 opposite to the cathode side 10 and a housing 2. In an exemplary embodiment, the semiconductor element 1 is an IGBT. The housing 2 comprises a cathode pole piece 3, which is arranged on the semiconductor element 1 on the cathode side 10, an anode pole piece 4, which is arranged on the semiconductor element 1 on the anode side 12, wherein the cathode pole piece 3 and the anode pole piece 4 laterally project the semiconductor element 1, and a spring system laterally surrounding the semiconductor element 1 for clamping the semiconductor element 1 between the cathode pole piece 3 and anode pole piece 4. The spring system is deflectable, i.e. compressible by clamping the pole pieces 3, 4 of the semiconductor switching device together. A semi-fabricated switching device shall mean that the semiconductor element 1 is assembled between a cathode pole piece 3 and an anode pole piece 4 with a spring system prepared for clamping the semiconductor element 1 between the cathode and anode pole piece 3, 4.

The spring system comprises a ring-shaped washer 6 laterally surrounding the semiconductor element 1, which washer 6 has a first side 60 and second side 62 opposite to the first side 60, a first deflection element 7 and a second deflection element 8. The washer 6 is made of a material, which keeps its shape reproducibly under deformation at least up to a spring deflection. The washer may be made of steel. Exemplarily, the washer 6 is made of spring steel, which is exemplarily a carbon comprising steel with a very high yield strength. Such material allows objects made of spring steel to return to their original shape despite deflection within the spring deflection, which is the maximum distance, by which the spring can be deflected without irreversibly deforming the spring.

The washer 6 is a hollow cylinder (ring) having a cylinder height and a width (which is the difference between an outer radius or an outer edge 66 and an inner radius or an inner edge 65 of the cylinder). The washer 6 is deflectable between the cathode pole piece 3 and the anode pole piece 4 by a first deflection element 7, which contacts the washer 6 in a first contact area 61 of the washer 6 on the first side 60, and by a second deflection element 8, which contacts the washer 6 in a second contact area 63 of the washer 6 on the second side 62. The first contact area 61 is displaced to the second contact area 63 so that the washer is deflectable between the first and second contact area 61, 63 by the first deflection element 7 and the second deflection element 8, through which a force can be exerted on the washer 6. The first deflection element 7 and the second deflection element 8 are adapted to deflect the washer 6 during clamping by a strain distance 64 such that the first deflection element 7 and the second deflection element 8 can deflect the washer 6 by a strain distance 64. The first deflection element 7 comprises at least one protruding element and the second deflection element 8 comprises at least one protruding element, at which protruding elements the deflection elements 7, 8 contact the washer 6. As the protruding elements of the first and second deflection element 7, 8 are positioned displaced and act on opposite sides of the washer 6, the washer 6 can be deflected by the deflection elements 7, 8 being pressed towards each other. The protruding elements of the first and second deflection elements 7, 8 are displaced at least by a distance, which corresponds to the height of the washer 6, so that the washer can be, i.e. is adapted to be strained between the two deflection elements 7, 8 up to a strain distance 64, which is less or equal to the spring deflection. The spring deflection shall be the maximum deflection distance, by which the spring (i.e. the washer 6) can be deflected, and at which the washer 6 returns to its original shape after releasing any applied force. The strain distance 64 is so large that in clamped condition an electrical contact is achievable between the cathode pole piece 3, the semiconductor element 1 and the anode pole piece 4, i.e. in a clamped condition the semiconductor element 1 contacts the cathode pole piece 3 on the cathode side 10 and the anode pole piece 4 on the anode side 12.

In FIG. 1 the strain distance 64 is shown as the distances 64_1 and 64_2 to indicate the cathode pole piece 3 and the anode pole piece 4 have to be brought into contact with the semiconductor element 1. The distance 64_1 and 64_2 corresponds to the strain distance 64, by which the washer 6 has to be deflected.

In an exemplary embodiment, the semi-fabricated device comprises two strain buffer plates 5, 5', one of which is arranged between the semiconductor element 1 and the cathode pole piece 3 and one of which is arranged between the semiconductor element 1 and the anode pole piece 4 (FIG. 2). The strain buffer plates 5, 5' are made of an electrically conductive material, which has a coefficient of thermal expansion which is between that of the semiconductor element and said pole piece, which is in contact to the strain buffer plate 5, 5', exemplarily the strain buffer plates 5, 5' are made of Molybdenum. As the strain buffer plates 5, 5' are arranged between the pole pieces 3, 4 and the semiconductor element 1, they have to be clamped between the pole pieces 3, 4 and the semiconductor element 1 to establish the electrical contact.

In an exemplary embodiment shown in FIG. 5 the first deflection element 7 is ring-shaped with a plurality of first protruding elements 70, 70', 70", 70''' each having a first height 72 or at least the first height 72. The height of a protruding element shall be such height, by which the protruding element projects an area in between two protruding elements (at which area the protruding element of the other/opposite lying deflection element acts/contacts on the washer). The first protruding elements 70, 70', 70", 70''' are spaced from each other along a first ring abutting surface 73 towards the first side 60 of the washer 6. The second deflection element 8 has a plurality of second protruding elements 80, 80', 80", 80''' each having a second height 82 or at least the second height 82. The second protruding elements 80, 80', 80", 80''' are spaced from each other along a second ring abutting surface 83 towards the second side 62 of the washer 6. The first protruding elements 70, 70', 70", 70''' contact the washer 6 at the first contact area 61 and the second protruding elements 80, 80', 80", 80''' contact the washer 6 at the second contact area 63. The first protruding elements 70, 70', 70", 70''' are positioned laterally to and in a displaced manner to the second protruding elements 80, 80', 80", 80''', so that the first protruding elements 70, 70', 70", 70''' deflect the washer 6 in a first area 61 displaced from the second contact area 63, at which the second protruding elements 80, 80', 80", 80''' contact the washer 6. Displaced shall mean that the elements are arranged lateral to each other in a plane parallel to the cathode side 10. The first height 72 as well as the second height 82 is at least as large as the strain distance 64. The washer 6 can be deflected between the first and second deflection elements 7, 8 such that the deflected washer has a wave shape along its circular direction. In such an arrangement, such sides of the deflection elements 7, 8, on which the first protruding elements 70, 70', 70", 70''' and the second protruding elements 80, 80', 80", 80''' are arranged, face each other. The first protruding elements 70, 70', 70", 70''' and/or the second protruding elements 80, 80', 80", 80''' may be arranged in a regular distance to each other, i.e. the first protruding elements 70, 70', 70", 70''' may be arranged equidistant from each other and/or the second protruding elements 80, 80', 80", 80''' may be arranged equidistant from each other. FIG. 5 shows such a first and second deflection element 7, 8 with a washer 6 to be placed between the deflection elements 7, 8.

FIG. 6 shows a cut through an inventive semiconductor switching device, in which a first protruding element 70 deflects the washer 6 towards the anode pole piece 4. Depending on the strain distance 64 and the first height 72 the washer 6 may touch the second deflection element 8 (in an area having no second protrusion element), but there may also be a distance between washer 6 and the second deflection element 8. FIG. 7 shows a cut through the same inventive semiconductor switching device as in FIG. 6, but at another place of the washer ring 6, in which a second protruding element 80 deflects the washer 6 towards the cathode pole piece 3. Depending on the strain distance 64 and the second height 82 the washer 6 may touch the first deflection element 7 (in an area having no first protrusion element), but there may also be a distance between washer 6 and the first deflection element 7.

Figure 9:
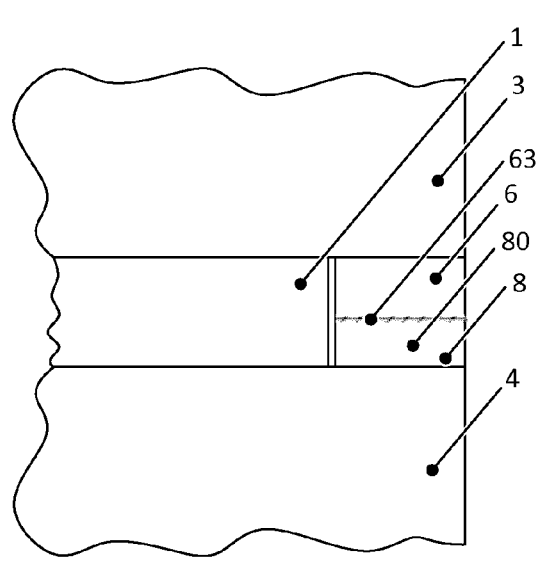

In an exemplary embodiment shown in FIGS. 8 and 9, the first and/or second deflection element 7, 8 is formed such that in such areas, in which a first protruding element 70, 70', 70", 70''', no second deflection element is arranged on the other side of the washer and/or vice versa. Depending on the strain distance 64 and the first height 72 the washer 6 may touch the anode pole piece 4 (FIG. 8), but there may also be a distance between washer 6 and the anode pole piece 4. Correspondingly, depending on the strain distance 64 and the second height 82 the washer 6 may touch the cathode pole piece 3 (in an area having no first protrusion element), but there may also be a distance between washer 6 and the cathode pole piece 3. Such design may be achieved by the first and/or second protruding elements 70, 70', 70", 70''', 80, 80', 80", 80''' being integrally formed with another element of the switching device, i.e. one of the pole pieces 3, 4, the gate leads or the insulating ring 9. Alternatively, the protruding elements 70, 70', 70", 70''', 80, 80', 80", 80''' may be formed with a ring laterally surrounding the protruding elements, so that no deflection element is between the washer 6 and the pole pieces at such areas, in which no protruding element is arranged.

In an exemplary embodiment, at least one or all first protruding element 70, 70', 70", 70''' is/are arranged at a central position between two second protruding elements 80, 80', 80", 80'''. Also at least one or all second protruding element 80, 80', 80", 80''' is/are arranged at a central position between two first protruding elements 70, 70', 70", 70'''.

Figure 10:
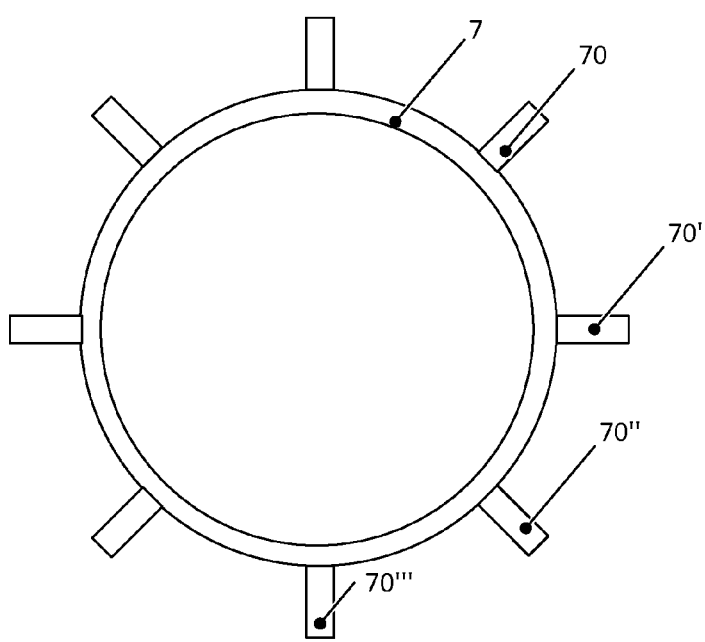
FIG. 10 shows a view on a semiconductor element with gate leads as first protruding elements.

In an exemplary embodiment, the first deflection element 7 is made of an electrically conductive material and it contacts a semiconductor gate electrode of the semiconductor element 1. The gate electrode may be electrically connected to an external circuit unit via the first protruding elements 70, 70', 70", 70'". The first protruding elements 70, 70', 70", 70'" are arranged around the semiconductor element 1 (FIG. 10). In this embodiment, the first protruding, electrically conductive elements 70, 70', 70", 70'" act additionally to their function as deflection element as gate leads, i.e. the first deflection element 7 forms a gate lead ring.

The FIGS. 14 to 17 show an exemplary embodiment of an inventive device, in which the washer 6 is deflected on one side by gate leads, which act as first protruding elements 70, 70', 70", 70'" and a second deflection element 8 having second protruding elements 80, 80'. On a lateral side, the semiconductor element is insulated by an insulator 90. The FIGS. 14 and 16 show the device in unclamped condition, the FIGS. 15 and 17 in clamped condition. Two first protruding elements 70, 70' and 70", 70'" are arranged between two second protruding elements 80, 80'. The dashed part of the first deflection element shall indicate that the first deflection element 7 leads out of the device for electrically contacting the gate electrode.

In an exemplary embodiment, an insulating ring 9 may laterally surround the semiconductor element 1. The ring is positioned between the semiconductor element 1 and the washer 6 (FIG. 4).

In an exemplary embodiment, the second deflection element 8 is made of an insulating material. In this embodiment, the second deflection element 8 may also separate the semiconductor element 1 from the washer 6, i.e. the second deflection element 8 may be integrally formed with the insulating ring 9 such that the second deflection element 8 separates the semiconductor element 1 from the washer 6.

The number of first protruding elements 70, 70', 70", 70'" may differ from the number of second protruding elements 80, 80', 80", 80'", so that two first or second protruding elements 70, 70', 70", 70'" or 80, 80', 80", 80'" may be neighboured without a second or first protruding element 80, 80', 80", 80'" or 70, 70', 70", 70'" in between. This can have advantages, e.g. if the first protruding elements 70, 70', 70", 70'" are gate leads, so that the number of gate leads can be optimized for the gate current flow independently from the number of first protruding elements 70, 70', 70", 70'" as deflection means. Exemplarily, additionally to gate leads, further first protruding elements could be added of insulating material.

In an exemplary embodiment, the first deflection element 7 has a ring-shaped third protruding element 75 having a third height 76, which contacts the washer 6 at the first contact area 61 along an inner edge 65 of the washer (FIG. 11). The figure shows a vertical cut through the semifabricated device. The second deflection element 8 also has a ring-shaped fourth protruding element 85 having a fourth height 86, which contacts the washer 6 at the second contact area 63 along an outer edge 66 of the washer 6. The third height 76 and the fourth height 86 is at least as large as the strain distance 64. The third and fourth protruding elements 75, 85 face each other. As one of the protruding elements contacts the washer 6 at the inner edge 65 and the other protruding element contacts the washer 6 at the outer edge 66, the first and second protruding elements 75, 85 are displaced to each other. FIG. 12 shows the first and second deflection elements 7, 8 of FIG. 11 in clamped condition. The third and fourth protruding elements 75, 85 have a distance to each other in clamped condition, which is at least as large as the thickness of the washer 6, so that the washer can be clamped between the third and fourth protruding elements 75, 85. Exemplarily, the third and fourth protruding elements 75, 85 are ring-shaped having a width, which is less than 25% of a width of the washer 6. The first and/or second deflection elements 7, 8 may be discrete ring-shaped elements (formed as a ring, exemplarily with an L-profile or a pure hollow cylinder). In another alternative embodiment, the third and/or fourth protruding elements 75, 85, and thus, the first and/or second deflection elements 7, 8 is or are integrally formed with the cathode and/or anode pole piece 4 or the insulating ring 9. Exemplarily, one of the pole pieces 3, 4 has a rim (ring-shaped protruding element at the side towards the washer 6, at which the washer 6 can rest) or the insulating ring 9 has a L-shape, at which the washer 6 can rest at the first contact area 61. In this embodiment, the washer 6 is deflected along its width direction.

In an exemplary embodiment, the first deflection element 7 is ring-shaped with a plurality of first protruding elements 70, 70', 70", 70'" each having a first height 72. The first protruding elements 70, 70', 70", 70'" are spaced from each other along a ring abutting surface 73. The first deflection element 7 further comprises a ring-shaped third protruding element 75 having a third height 76, which contacts the washer 6 along an inner edge 65 of the washer. The second deflection element 8 is also ring-shaped with a plurality of second protruding elements 80, 80', 80", 80'" each having a second height 82. The second protruding elements 80, 80', 80", 80'" are spaced from each other along a ring abutting surface 83. The second deflection element 8 further comprises a ring-shaped fourth protruding element 85 having a fourth height 86, which contacts the washer 6 along an outer edge 66 of the washer. The first protruding elements 70, 70', 70", 70'" are positioned in a displaced manner to the second protruding elements 80, 80', 80", 80'". The first protruding elements 70, 70', 70", 70'" and the third protruding element 75 face the second protruding elements 80, 80', 80", 80'" and the fourth protruding element 85. At least one of or both of a) the first height 72 and the second height 82 is at least as large as the strain distance 64 and b) the third height 76 and the fourth height 86 is at least as large as the strain distance 64. In this embodiment, the washer 6 is deflected in its width direction (i.e. between the inner and outer edge 65, 66) as well as along its circular direction (ring abutting surface).

In an exemplary embodiment, the invention concerns a semiconductor switching device, in which a semiconductor element 1 is clamped between the cathode pole piece 3 and the anode pole piece 4 such that the cathode pole piece 3, the semiconductor element 1 and the anode pole piece 4 are electrically connected. In this embodiment, the first deflection element 7 and the second deflection element 8 deflect the washer 6 by the strain distance 64. A clamping element 20 clamps the semiconductor element 1 between the cathode and anode pole piece 3, 4 (FIGS. 3 and 4; the figures do not show any details of the washer, in particular these figures do not indicated the shifted positions of the first or second contact area). The spring system laterally from and surrounding the semiconductor element 1 allows to achieve a reliable electrical connection between the pole pieces 3, 4 and the semiconductor element 1. Exemplarily, a force is applied on the pole pieces 3, 4 by the clamping element 20, due to which the first deflection element 7 and the second deflection element 8 deflect the washer 6 with a spring force of at least 1 kN. The strain distance 64, by which the washer 6 is compressed, is exemplarily at least 0.2 mm. In another exemplary embodiment, the strain distance 64 is between 0.2 mm and 1.5 mm or between 0.4 and 0.6 mm. Such a spring force and such a distance ensure that the electrical connection between semiconductor element 1 and pole pieces 3, 4 is reliable.

FIG. 4 shows an exemplary embodiment, in which an insulating ring 9 is arranged between the semiconductor element 1 and the washer 6, so that the semiconductor element 1 is separated from the spring system.

The deflection elements 3, 4 may comprise an alignment element, by which the position of the protruding elements 70, 70', 70", 70''', 80, 80', 80", 80''' is defined. Such alignment elements may be pins and recesses or any other position fixation elements.

The housing 2 may comprises more elements well-known to the persons skilled in the art. Exemplarily, the housing comprises an insulation tube 92 having creepage sections at the outside thereof in order to deviate creepage currents (FIGS. 14 and 15).

LIST OF DESIGNATIONS

1 semiconductor element
10 cathode side
12 anode side
2 housing
20 clamping element
3 cathode pole piece
4 anode pole piece
5, 5' strain buffer plate
6 washer
60 first side
61 first contact area
62 second side
63 second contact area
64, 64_1, 64_2 strain distance
65 inner edge
66 outer edge
68, 68' support element
69, 69' Belleville spring
7 first deflection element
70, 70', 70", 70''' first protruding element
72 first height
73 first ring abutting surface
75 third protruding element
76 third height
8 second deflection element
80, 80', 80", 80''' second protruding element
82 second height
83 second ring abutting surface
85 fourth protruding element
86 fourth height
9 insulating ring
90 insulator
92 insulation tube

The invention claimed is:

1. A semiconductor switching device comprising:
a semiconductor element having a cathode side and an anode side opposite to the cathode side; and
a housing, wherein the housing comprises:
a cathode pole piece arranged on the semiconductor element on the cathode side;
an anode pole piece is arranged on the semiconductor element on the anode side, wherein the cathode pole piece and the anode pole piece laterally project beyond the semiconductor element; and
a spring system laterally surrounding the semiconductor element for clamping the semiconductor element between the cathode pole piece and anode pole piece, wherein the spring system comprises a ring-shaped washer laterally surrounding the semiconductor element, the washer having a first side and second side opposite to the first side;
wherein the washer is made of a material that keeps its shape reproducibly under deformation at least up to a spring deflection;
wherein the washer is deflectable between the cathode pole piece and the anode pole piece by a first deflection element that comprises a plurality of first protruding elements that contact the washer in a first contact area of the washer on the first side, and by a second deflection element that comprises a plurality of second protruding elements that contact the washer in a second contact area of the washer on the second side;
wherein the first protruding elements are spaced from each other and wherein the second protruding elements are spaced from each other and offset from the first protruding elements so that the first contact area is laterally displaced to the second contact area and the first contact area and the second contact area are arranged lateral to each other in a plane parallel to the cathode side; and
wherein the first deflection element and the second deflection element are adapted to deflect the washer during clamping by a strain distance that is less or equal to the spring deflection, wherein the strain distance is sufficiently large that in a clamped condition an electrical contact is achievable between the cathode pole piece, the semiconductor element and the anode pole piece.

2. The device according to claim 1, further comprising a first strain buffer plate arranged between the semiconductor element and the cathode pole piece and a second buffer plate arranged between the semiconductor element and the anode pole piece.

3. The device according to claim 1, wherein the washer is made of steel.

4. The device according to claim 1, wherein the first deflection element is ring-shaped and the plurality of the first protruding elements each have a first height, and
wherein the second protruding elements each having a second height; and
wherein the first height and the second height are at least as large at the strain distance and wherein the first protruding elements contact the washer at the first contact area and the second protruding elements contact the washer at the second contact area.

5. The device according to claim 1, wherein the first protruding elements are arranged in a regular distance to each other.

6. The device according to claim 1, wherein the first deflection element is made of an electrically conductive material, wherein the first deflection element contacts a gate electrode of the semiconductor switching device, and wherein the gate electrode is electrically connected to an external circuit unit via the first protruding elements.

7. The device according to claim 1, wherein the number of first protruding elements differs from the number of second protruding elements.

8. The device according to claim 1, wherein the second deflection element is made of an insulating material and wherein the second deflection element separates the semiconductor element from the washer.

9. The device according to claim 1, wherein the first protruding element is ring-shaped and has a third height, wherein the first protruding element contacts the washer at the first contact area along an inner edge of the washer, wherein the second protruding element is ring-shaped and has a fourth height, wherein the second protruding element contacts the washer at the second contact area along an outer edge of the washer, and wherein each of the third height and the fourth height is at least as large as the strain distance.

10. A semiconductor switching device, wherein a semifabricated semiconductor switching device according to claim 1 is clamped by a clamping element between the cathode pole piece and the anode pole piece so as to electrically connect the cathode pole piece, the semiconductor element and the anode pole piece, wherein the clamping element applies a force on the cathode pole piece and the anode pole piece, and in that the first deflection element and the second deflection element deflect the washer by the strain distance.

11. The semiconductor switching device according to claim 10, wherein the first deflection element and the second deflection element deflect the washer with a spring force of at least 1 kN.

12. The semiconductor switching device according to claim 10, wherein the strain distance is at least 0.2 mm.

13. The device according to claim 4, wherein one of the first protruding elements is arranged at a central position between two second protruding elements.

14. The device according to claim 1, wherein the first protruding elements are spaced from each other along a first ring abutting surface towards the first side and wherein the second protruding elements are spaced from each other along a second string abutting surface towards the second side.

15. A semiconductor switching device comprising:
a semiconductor element having a cathode side and an anode side opposite to the cathode side; and
a housing, wherein the housing comprises:
a cathode pole piece arranged on the semiconductor element on the cathode side;
an anode pole piece is arranged on the semiconductor element on the anode side, wherein the cathode pole piece and the anode pole piece laterally project beyond the semiconductor element; and
a spring system laterally surrounding the semiconductor element for clamping the semiconductor element between the cathode pole piece and anode pole piece, wherein the spring system comprises a ring-shaped washer laterally surrounding the semiconductor element, the washer having a first side and second side opposite to the first side;
wherein the washer is made of a material that keeps its shape reproducibly under deformation at least up to a spring deflection;
wherein the washer is deflectable between the cathode pole piece and the anode pole piece by a first deflection element that comprises ring-shaped first protruding element that contacts the washer at a first contact area along an inner edge of the washer on the first side and by a second deflection element that comprises a ring-shaped second protruding element that contacts the washer at a second contact area along an outer edge of the washer on the second side;
wherein the first contact area is laterally displaced to the second contact area and the first contact area and the second contact area are arranged lateral to each other in a plane parallel to the cathode side;

wherein the first deflection element and the second deflection element are adapted to deflect the washer during clamping by a strain distance that is less or equal to the spring deflection;

wherein the first protruding element and the second protruding element each have a height that is at least as large as the strain distance; and wherein the strain distance is sufficiently large that in a clamped condition an electrical contact is achievable between the cathode pole piece, the semiconductor element and the anode pole piece.

16. The device according to claim 15, wherein the first protruding element and the second protruding element have a lateral width that is less than 25% of a lateral width of the washer.

17. The device according to claim 15, wherein the second deflection element is integrally formed with the one of the cathode and anode pole pieces.

18. The device according to claim 15, further comprising a first strain buffer plate arranged between the semiconductor element and the cathode pole piece and a second buffer plate arranged between the semiconductor element and the anode pole piece.

19. The device according to claim 15, wherein the washer is made of steel.

20. A semiconductor switching device comprising:
a semiconductor element having a cathode side and an anode side opposite to the cathode side; and
a housing, wherein the housing comprises:
a cathode pole piece arranged on the semiconductor element on the cathode side;
an anode pole piece is arranged on the semiconductor element on the anode side, wherein the cathode pole piece and the anode pole piece laterally project beyond the semiconductor element; and
a spring system laterally surrounding the semiconductor element for clamping the semiconductor element between the cathode pole piece and anode pole piece, wherein the spring system comprises a ring-shaped washer laterally surrounding the semiconductor element, the washer having a first side and second side opposite to the first side;
wherein the washer is made of a material that keeps its shape reproducibly under deformation at least up to a spring deflection;
wherein the washer is deflectable between the cathode pole piece and the anode pole piece by a first deflection element that contacts the washer on the first side of the washer and by a second deflection element that contacts the washer on the second side of the washer;
wherein the first deflection element is ring-shaped with a plurality of first protruding elements each having a first height and a ring-shaped third protruding element having a third height, wherein the first deflection element contacts the washer at a first contact area along an inner edge of the washer, the first protruding elements being spaced from each other along a first ring abutting surface;
wherein the second deflection element is ring-shaped with a plurality of second protruding elements each having a second height and a ring-shaped fourth protruding element having a fourth height, wherein the second deflection element contacts the washer at a second contact area along an outer edge of the washer, the second protruding elements being spaced from each other along a second ring abutting surface;

wherein the first contact area is laterally displaced to the second contact area and the first contact area and the second contact area are arranged lateral to each other in a plane parallel to the cathode side;

wherein the first deflection element and the second deflection element are adapted to deflect the washer during clamping by a strain distance that is less or equal to the spring deflection, wherein the strain distance is sufficiently large that in a clamped condition an electrical contact is achievable between the cathode pole piece, the semiconductor element and the anode pole piece; and wherein the first height and the second height are at least as large as the strain distance or the third height and the fourth height are at least as large as the strain distance.

* * * * *